United States Patent [19]

Shadan et al.

[11] Patent Number: 5,703,803
[45] Date of Patent: Dec. 30, 1997

[54] DYNAMICALLY CONTROLLED, CROSS-STACKED CAM CELL

[75] Inventors: Victor Shadan, Santa Clara; Anurag Nigam, Mountain View, both of Calif.

[73] Assignee: Intel Corporation, Santa Clara, Calif.

[21] Appl. No.: 639,556

[22] Filed: Apr. 29, 1996

[51] Int. Cl.$^6$ .................................................. G11C 15/00
[52] U.S. Cl. ................... 365/49; 365/189.07; 327/51; 327/52
[58] Field of Search ................... 365/49, 189.07; 327/51, 52; 326/52, 54, 55

[56] References Cited

U.S. PATENT DOCUMENTS

| | | | |
|---|---|---|---|
| 3,252,011 | 5/1966 | Zuk | 326/55 |
| 5,490,102 | 2/1996 | Jubran | 365/49 |
| 5,568,073 | 10/1996 | McClure | 327/51 |

Primary Examiner—David C. Nelms
Assistant Examiner—F. Niranjan
Attorney, Agent, or Firm—Blakely, Sokoloff, Taylor & Zafman

[57] ABSTRACT

A memory cell comprising a storage cell and a comparison circuit. The storage cell has a second node and a third node. The comparison circuit is coupled to the storage cell and comprises a first plurality of transistors coupled in series to a first input and a second plurality of transistors coupled in series to a second input and coupled to the first plurality of transistors by a first node and by a source voltage node. A match line coupled to the first node indicates a miss when values on the first and second inputs are different than values stored in the storage cell.

5 Claims, 2 Drawing Sheets

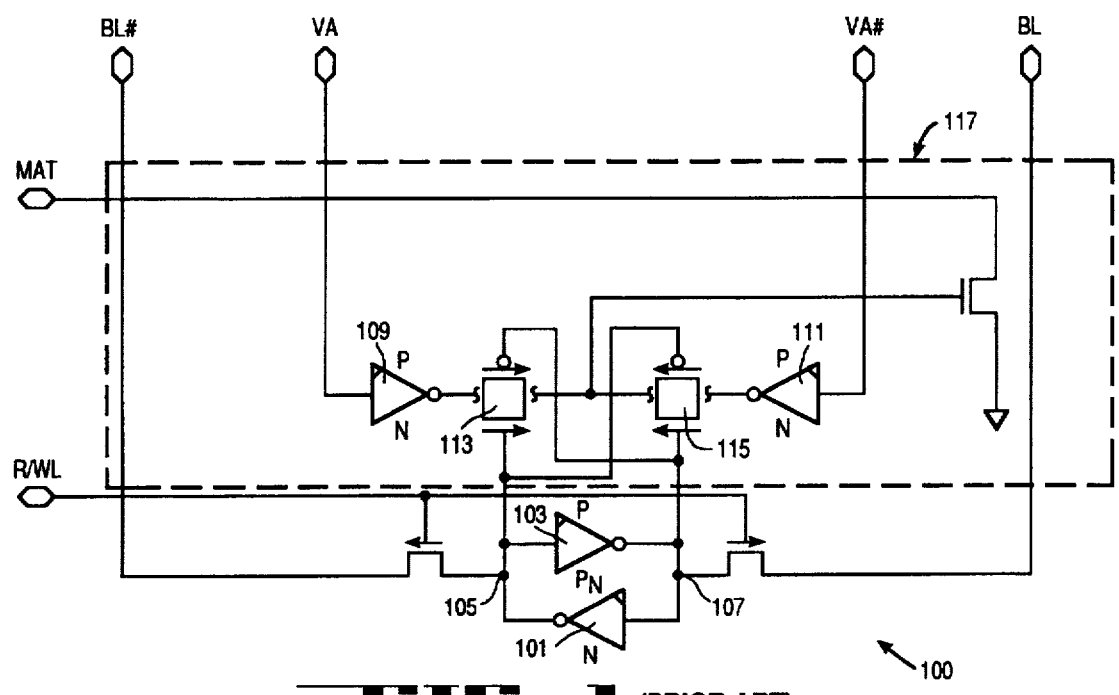
FIG_1 (PRIOR ART)
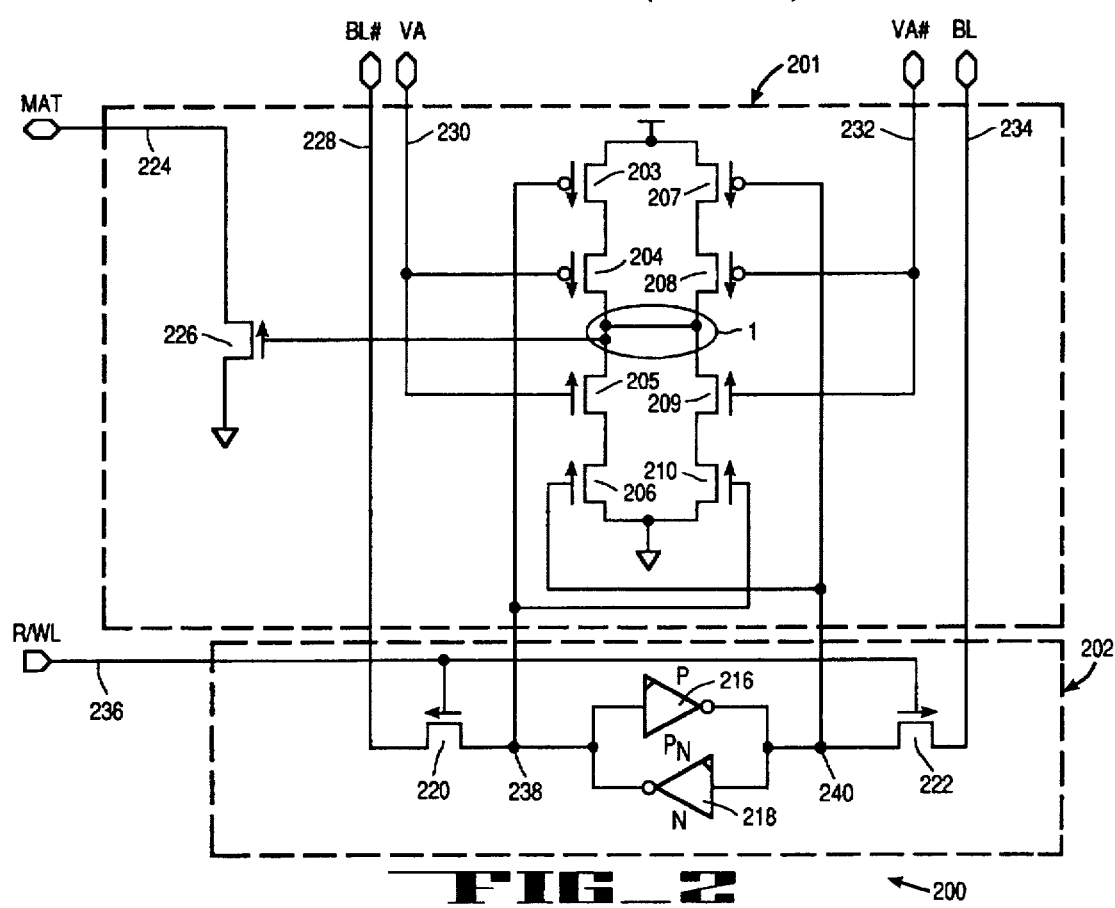
FIG_2

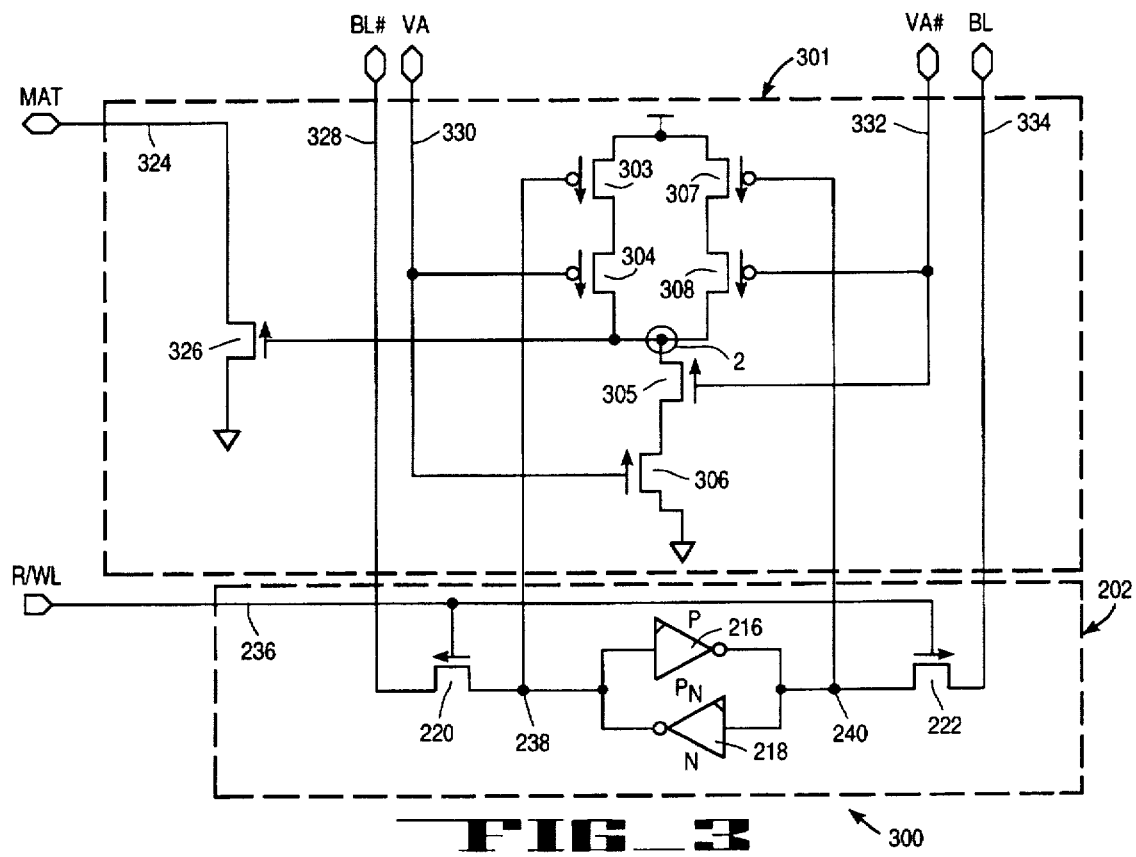
FIG_3
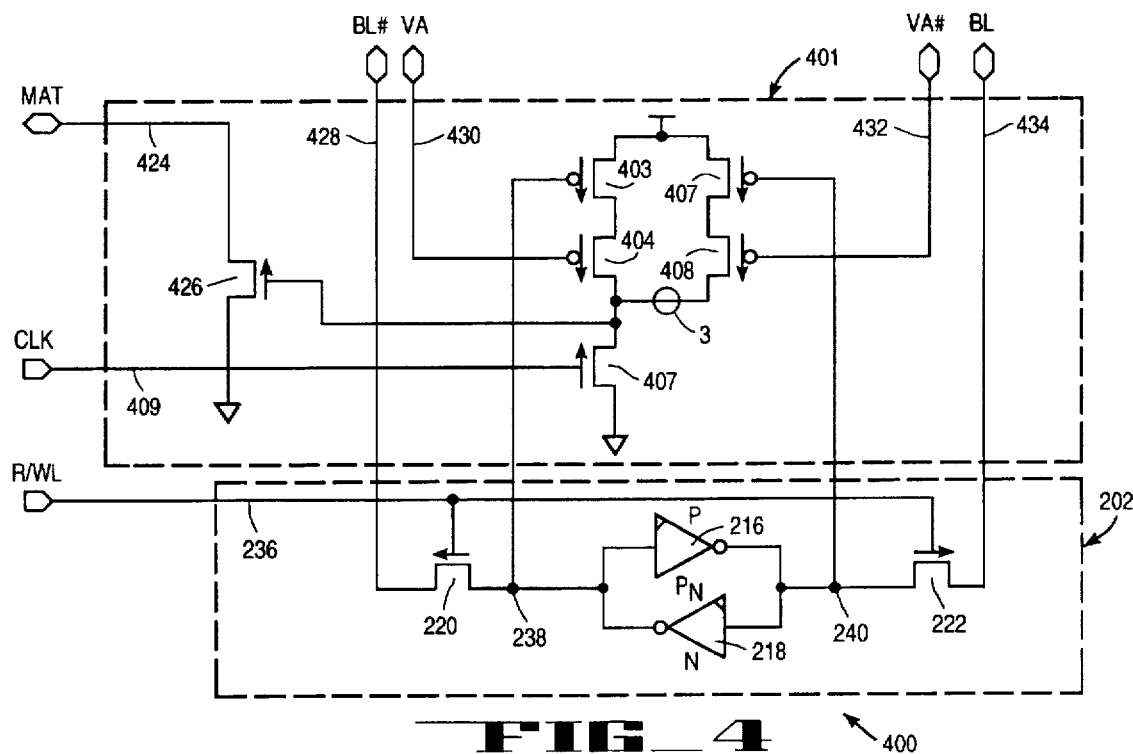
FIG_4

5,703,803

1

DYNAMICALLY CONTROLLED, CROSS-STACKED CAM CELL

FIELD OF THE INVENTION

The present invention pertains to the field of integrated circuit devices. More particularly, the present invention refers to an improved content addressable memory cell.

BACKGROUND OF THE INVENTION

Content addressable memories (CAMs) are typically arrays of CAM cells. Each CAM cell usually includes a storage cell storing one bit of information and comparator circuitry. CAM cells are usually arranged in rows and columns such that each row stores an address. Each row of the CAM has a match line associated with it for indicating whether an address presented to the CAM matches an address stored in the row. The comparator circuitry of the CAM cell performs a comparison between the bit stored in the storage cell and a value on an input line which is one of the bits of the address presented to the CAM for comparison. If the values do not match, the match line, which is precharged to a high logic level, is pulled low by circuitry of the CAM cell.

FIG. 1 shows prior CAM cell 100. Inverters 101 and 103 comprise a storage cell. Inverters 109 and 111 and pass gates 113 and 115 comprise comparator circuit 117. Pass gates 113 and 115 each include a p-type metal oxide semiconductor (PMOS) transistor and an n-type MOS (NMOS) transistor. Inverters 109 and 111 each include two MOS transistors. Comparator circuit 117 performs a comparison between the value on virtual address line VA and the value on node 105. Comparator circuit 117 also performs a comparison between the inverse of VA, or VA0#, and the value on node 107.

In silicon-based semiconductor circuits such as those embodying CAMs, it is desirable to use as little space as possible on the silicon when laying out a device. It is also desirable to lay out devices, such as CAMs, in a way which minimizes capacitance because increased capacitance can reduce circuit speed. Capacitance and integrated circuit area become more significant as CAMs increase in size.

Due to topographical design rules, configuring MOS transistors as shown in FIG. 1 is not the most efficient layout in terms of silicon space taken. For example, placing NMOS and PMOS transistors together as shown for pass gates 113 and 115 requires more silicon area than two transistors of the same type placed in similar proximity.

SUMMARY OF THE INVENTION

Accordingly, the present invention provides an improved content addressable memory cell which uses less layout area.

A memory cell comprising a storage cell and a comparison circuit is described. In one embodiment, the storage cell has a second node and a third node. The comparison circuit coupled to the storage cell comprises a first plurality of transistors coupled in series to a first input and a second plurality of transistors coupled in series to a second input and coupled to the first plurality of transistors by a first node and by a source voltage node. A match line coupled to the first node indicates a miss when values on the first and second inputs are different than values stored in the storage cell.

2

BRIEF DESCRIPTION OF THE DRAWINGS

FIG. 1 is a circuit diagram of a prior CAM cell;

FIG. 2 is a circuit diagram of an embodiment of a CAM cell of the present invention;

FIG. 3 is a circuit diagram of another embodiment of a CAM cell of the present invention;

FIG. 4 is a circuit diagram of yet another embodiment of a CAM cell of the present invention.

DETAILED DESCRIPTION

In the following detailed description of the present invention numerous specific details are set forth in order to provide a thorough understanding of the present invention. However, it will be obvious to one skilled in the art that the present invention may be practiced without these specific details. In other instances well known methods, procedures, components, and circuits have not been described in detail to avoid unnecessarily obscuring the present invention.

A content addressable memory (CAM) cell will be described that provides full functionality and uses less integrated circuit area.

FIG. 2 shows an embodiment of CAM cell 200 of the present invention. CAM cell 200 is one of an array of CAM cells in a CAM. Multiple CAM cells 200 are arranged in rows and columns, with a row of CAM cells 200 storing an address. CAM cell 200 comprises comparison circuit 201 and storage cell 202.

Bit line 228 and inverted bit line 234 comprise a bit to be written to the CAM cell when the contents of the CAM are forced to a predetermined value. Bit line 228 carries the bit to be stored in CAM 200, and inverted bit line 234 carries the inverse of the bit to be stored. Read/write line 236 enables values on bit line 228 and inverted bit line 234 to be stored in storage cell 202. A high value on read/write line 236 causes transistors 220 and 222 to conduct ("turns them on"), which pass the values on bit line 228 and inverted bit line 234 to a latch made up of inverters 216 and 218. After, the write operation is complete, read/write line 236 is disabled. The value on bit line 228 will then remain on node 238 and the value on inverted bit line 234 will remain on node 240.

Read/write line 236 also performs the function of allowing a value stored in storage cell 202 to be read out for diagnostic purposes. This function is not pertinent to the present invention.

When a look-up operation occurs in a CAM, a virtual address is presented to the CAM on virtual address lines and is compared to addresses stored in rows of the CAM on a bit-by-bit basis. A bit of a virtual address is carried on virtual address line 230 and the inverse of the virtual address bit is carried on inverted virtual address line 232. At an initial stage, before comparison, both virtual address line 230 and inverted virtual address line 232 are high. When the virtual address is resolved for comparison, one of lines 230 or 232 goes to a low value. Depending upon the results of the comparison between values at nodes 238 and 240 and values on lines 230 and 232, node 1 will remain at a low value, indicating a match, or transition to a high value, indicating a miss. When a miss occurs in CAM cell 200, node 1 transitions high, turning on transistor 226 and discharging match line 224. Match line 224 is precharged to a high value.

In the circuit of FIG. 2, node 1, which indicates a hit or a miss in CAM cell 200, is never allowed to float. Initially, both of lines 230 and 232 are high, causing both of transistors 205 and 209 to conduct. Because either one of nodes 238 or 240 must be high at all times, either one of transistors 206 or 210 will conduct, causing node 1 to be pulled low. When the virtual address is resolved, one of lines 230 and 232 transitions low. For example, virtual address line 230 can transition low, causing transistor 205 to stop conducting. The states of the other transistors connected to node 1, however, assure that node one is either pulled low or high during comparison, and never allowed to float. Because node 1 is always tied to a logic one or a logic zero, it is not possible for match line 224 to reflect a false hit or miss due to physical circuit variances. The integrity of the match line, therefore, does not depend on when it is sampled, making timing less critical for this embodiment.

Cam cell 200 provides the functionality required of CAM cells, but because of their configuration, transistors 203-210 can be laid out on a reduced area on the integrated circuit embodying the CAM. Transistors of the same type laid out in series, or stacked, can share the same p-type or n-type silicon substrate while each transistor has its own gate region. Transistors which are not laid out this way, as in the prior art CAM cell of FIG. 1, each have distinct p-type or n-type regions, with the transistors being connected by contacts.

Another advantage of the stacked configuration of the present invention is that operating capacitance is reduced because p-type or n-type regions are shared rather than connected by contacts. For this reason, circuit operation with stacked transistors of the same type is usually faster.

FIG. 3 is a circuit diagram of an embodiment of a CAM cell 300. Cam cell 300 comprises comparison circuit 301 and storage cell 202. Comparison circuit 301 uses two less transistors than comparison circuit 201 of the embodiment of FIG. 2. Because two less transistors are used, and the transistors of comparison circuit 301 are stacked, even more integrated circuit area can be conserved.

Initially, virtual address line 330 and inverse virtual address line 332 are both high. This causes transistors 305 and 306 to conduct, transistor 326 to be off and match line 324 to be high. Therefore, node 2 of comparison circuit 301 is initially at a low logic level, and match line 324 is at a high logic level. When the virtual address is resolved and one of lines 330 or 332 transition to a low level, one of transistors 305 or 306 will be turned off. Transistors 303-304 and 307-308 are two stacks of transistors connected to node 2. Depending upon the values on nodes 238 and 240, either both stacks will be off, and node 2 will remain low, or one stack will turn on and node 2 will transition to a high logic level. A high logic level on node 2 reflects a miss which will be indicated by match line 324 transitioning low in response to transistor 326 being turned on. In this way, CAM cell 300 functions like CAM cell 200 with less transistors.

Node 2 of comparison circuit 301, however, can float under certain conditions. For example, when one of transistors 305 or 306 are turned off, no path to ground is available for node 2. The condition of node 2 is predetermined unless a noise is coupled into the node, disturbing the contents. Therefore, it is important that the states of transistors 303-304 and 307-308 be resolved before node 2 changes state, so that a false indication of a hit or miss is not transferred to match line 324. Where area is a major concern, CAM cell 300, which uses two less transistors than CAM cell 200, can be used with a system design that takes the timing concerns into account.

FIG. 4 is a circuit diagram of an embodiment of a CAM cell 400. CAM cell 400 comprises comparison circuit 401 and storage cell 202. Comparison circuit 401 uses only five transistors, one less transistor than CAM cell 300. In this embodiment, virtual address line 430 and inverted virtual address line 432 are each coupled to the gate of only one transistor rather than two, as in other embodiments. Therefore, the load on lines 430 and 432 is reduced. Comparison circuit 401 functions logically like comparison circuits of other embodiments. In this embodiment, however, transistor 407 is clocked by clock line 409 coupled to its gate. Node 3 is initially low and transitions to high only upon a miss. In this embodiment, clock line 409 provides a regular precharge interval. That is, during the regular periods when clock line 409 carries a high logic level, node 3 is pulled low, allowing match line 424 to be precharged. This embodiment can experience periods during which node 3 can float, as described with respect to FIG. 3. The use of a clock in this embodiment allows a designer to time evaluations of the CAM based on the level of a clock. This embodiment uses fewer transistors than other embodiments and so uses less integrated circuit area.

What is claimed is:

1. An apparatus that stores a bit in a content addressable memory, comprising:
  a storage cell comprising:
   a second node that stores an inverse of an address bit;
   a third node that stores the address bit;
   a read/write input that enables the address bit and the inverse of the address bit to be stored in the storage cell;
  a comparison circuit coupled to the storage cell through the second and third nodes, comprising:
   a first transistor of a first type having a source coupled to a source voltage node and a gate coupled to the second node;
   a second transistor of the first type having a source coupled to a drain of the first transistor, a gate coupled to a first input that carries a virtual address bit, and a drain coupled to a first node;
   a third transistor of the first type having a source coupled to the source voltage node and a gate coupled to the third node;
   a fourth transistor of the first type having a source coupled to a drain of the third transistor, a gate coupled to a second input that carries an inverse of the virtual address bit, and a drain coupled to the first node;
   a match indication line coupled to the first node that indicates a miss when values on the first and second inputs do not match values stored in the storage cell.

2. The apparatus of claim 1, further comprising a fifth transistor of the second type having a gate coupled to the first node, a drain coupled to a ground potential, and a source coupled to the match indication line.

3. The apparatus of claim 2, further comprising a sixth transistor of the second type having a source coupled to the first node, a gate coupled to a clock line, and a drain coupled to the ground potential, the fifth transistor causing the match indication line to change value when a miss is indicated and the clock line has a high value.

4. The apparatus of claim 2, further comprising a sixth transistor of the second type having a source coupled to the first node and a gate coupled to the second input.

5. The apparatus of claim 4, further comprising a seventh transistor of the second type having a source coupled to the drain of the sixth transistor, a drain coupled to the ground potential, and a gate coupled to the first input.

\* \* \* \* \*